(12) United States Patent
Turullols et al.

(10) Patent No.: US 11,720,735 B2
(45) Date of Patent: Aug. 8, 2023

(54) FLAT SHELL FOR AN ACCELERATOR CARD

(71) Applicant: Xilinx, Inc., San Jose, CA (US)

(72) Inventors: Sebastian Turullols, Los Altos, CA (US); Kyle Corbett, Campbell, CA (US); Sudipto Chakraborty, Longmont, CO (US); Siva Santosh Kumar Pyla, Hyderabad (IN); Ravinder Sharma, Hyderabad (IN); Kaustuv Manji, Hyderabad (IN); Jayaram Pvss, Hyderabad (IN); Stephen P. Rozum, Loveland, CO (US); Ch Vamshi Krishna, Hyderabad (IN); Susheel Puthana, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 153 days.

(21) Appl. No.: 17/408,218

(22) Filed: Aug. 20, 2021

(65) Prior Publication Data
US 2023/0055704 A1 Feb. 23, 2023

(51) Int. Cl.
*G06F 30/392* (2020.01)
*G06F 30/398* (2020.01)
*G06F 30/3953* (2020.01)

(52) U.S. Cl.
CPC .......... *G06F 30/392* (2020.01); *G06F 30/398* (2020.01); *G06F 30/3953* (2020.01)

(58) Field of Classification Search
CPC ..................................................... G06F 30/392

USPC ........................................................ 716/119
See application file for complete search history.

(56) References Cited

U.S. PATENT DOCUMENTS

| | | |
|---|---|---|
| 7,739,092 B1 | 6/2010 | Ballagh |
| 7,941,777 B1 | 5/2011 | Young |
| 8,166,431 B1 | 4/2012 | McAndrew et al. |
| 8,332,788 B1 | 12/2012 | Young |
| 8,928,351 B1 | 1/2015 | Konduru |
| 9,323,876 B1 | 4/2016 | Lysaght et al. |
| 9,710,582 B1 | 7/2017 | Nagpal et al. |
| 9,846,660 B2 | 12/2017 | Styles et al. |
| 9,880,966 B1 | 1/2018 | Hwang et al. |
| 10,031,760 B1 | 7/2018 | Santan et al. |

(Continued)

OTHER PUBLICATIONS

Xilinx, SmartSSD Computational Storage Drive Installation and User Guide, UG1382 (v1.2) Jun. 17, 2021, 66 pages.
(Continued)

*Primary Examiner* — Eric D Lee
(74) *Attorney, Agent, or Firm* — Kevin T. Cuenot

(57) ABSTRACT

Using a flat shell for an accelerator card includes reading a flat shell from one or more computer readable storage media using computer hardware, wherein the flat shell is a synthesized, unplaced, and unrouted top-level circuit design specifying platform circuitry. A kernel specifying user circuitry is synthesized using the computer hardware. The kernel is obtained from the one or more computer readable storage media. The synthesized kernel is linked, using the computer hardware, to the flat shell forming a unified circuit design. The unified circuit design is placed and routed, using the computer hardware, to generate a placed and routed circuit design specifying the platform circuitry and the user circuitry for implementation in an integrated circuit.

20 Claims, 6 Drawing Sheets

(56) References Cited

U.S. PATENT DOCUMENTS

| | | | |
|---|---|---|---|
| 10,489,543 | B1 | 11/2019 | Lysaght et al. |
| 10,608,641 | B2 | 3/2020 | Yu et al. |
| 10,621,299 | B1 | 4/2020 | Yu et al. |
| 10,651,853 | B1 | 5/2020 | Kong et al. |
| 10,673,439 | B1 | 6/2020 | Ahmad et al. |
| 10,725,942 | B2 | 7/2020 | Thyamagondlu et al. |
| 10,747,516 | B1 * | 8/2020 | Kain .................... G06F 30/347 |
| 10,796,058 | B1 | 10/2020 | Mezei et al. |
| 10,817,353 | B1 | 10/2020 | Kain et al. |
| 10,924,430 | B2 | 2/2021 | Thyamagondlu et al. |
| 10,977,018 | B1 | 4/2021 | Hwang et al. |
| 11,055,106 | B1 | 7/2021 | Cochell et al. |
| 11,063,594 | B1 | 7/2021 | Ahmad et al. |
| 2021/0124711 | A1 | 4/2021 | Ansari et al. |

OTHER PUBLICATIONS

Xilinx Answer 46888, Virtex-5 Endpoint Block Plus for PCI Express—Debugging and Packet Analysis Guide with Downstream Port Model and PIO Example Design, 61 pages.

* cited by examiner

FLAT SHELL FOR AN ACCELERATOR CARD

TECHNICAL FIELD

This disclosure relates to integrated circuits (ICs) and, more particularly, to using a flat shell with a user kernel for implementation in an accelerator card.

BACKGROUND

A data processing system, e.g., a computer, may include or be connected to any of a variety of different peripheral devices that are designed to expand the functionality of the data processing system. In some cases, these peripheral devices are implemented as a "card" that can be inserted into an available bus slot of the data processing system. For example, a variety of cards are available that may be inserted into an unoccupied PCIe slot of a data processing system. In other cases, the peripheral device is implemented in a housing or chassis that may be physically separate from the data processing system. The peripheral device may be communicatively linked to the data processing system through another type of connection.

These different types of peripheral devices are often referred to as "expansion cards." One type of expansion card, known as an "accelerator card," may be used with a data processing system to accelerate the performance of a given workload. An application executed by the processor of the data processing system may offload a workload to the accelerator card. The accelerator card may perform the workload more efficiently, faster, and/or using less power, than were the processor of the data processing system to perform the workload. The accelerator card makes any results from performing the workload available to the host system.

SUMMARY

In an example implementation, a method can include reading a flat shell from one or more computer readable storage media using computer hardware. The flat shell is a synthesized, unplaced, and unrouted top-level circuit design specifying platform circuitry. The method can include synthesizing, using the computer hardware, a kernel specifying user circuitry, wherein the kernel is obtained from the one or more computer readable storage media. The method can include linking, using the computer hardware, the synthesized kernel to the flat shell forming a unified circuit design. The method also can include, using the computer hardware, placing and routing the unified circuit design to generate a placed and routed circuit design specifying the platform circuitry and the user circuitry for implementation in an integrated circuit (IC).

In another example implementation, a system includes a processor configured to initiate operations. The operations can include reading a flat shell from one or more computer readable storage media. The flat shell is a synthesized, unplaced, and unrouted top-level circuit design specifying platform circuitry. The operations can include synthesizing a kernel specifying user circuitry, wherein the kernel is obtained from the one or more computer readable storage media. The operations can include linking the synthesized kernel to the flat shell forming a unified circuit design. The operations also can include placing and routing the unified circuit design to generate a placed and routed circuit design specifying the platform circuitry and the user circuitry for implementation in an IC.

In another example implementation, a computer program product includes one or more computer readable storage media, and program instructions collectively stored on the one or more computer readable storage media. The program instructions are executable by computer hardware to initiate operations. The operations can include reading a flat shell from the one or more computer readable storage media. The flat shell is a synthesized, unplaced, and unrouted top-level circuit design specifying platform circuitry. The operations can include synthesizing a kernel specifying user circuitry, wherein the kernel is obtained from the one or more computer readable storage media. The operations can include linking the synthesized kernel to the flat shell forming a unified circuit design. The operations also can include placing and routing the unified circuit design to generate a placed and routed circuit design specifying the platform circuitry and the user circuitry for implementation in an integrated circuit.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

Figure 1:
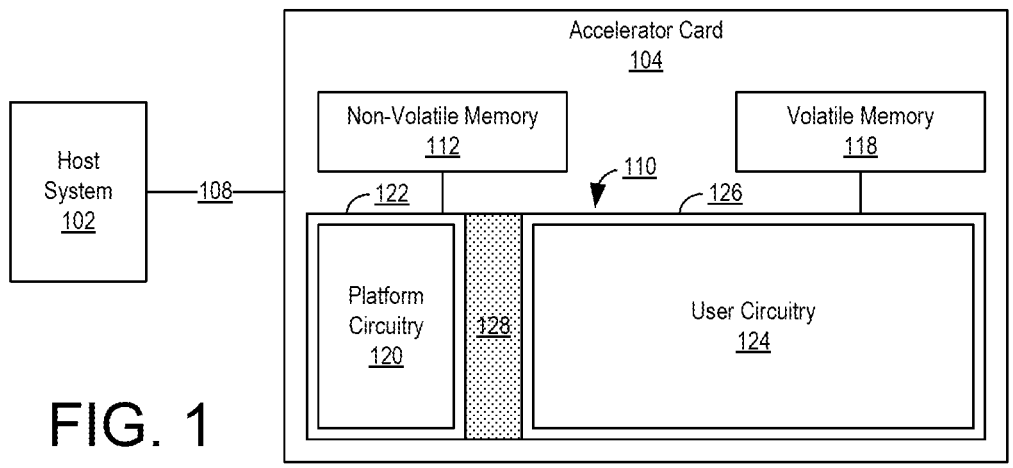
FIG. 1 illustrates an example computing environment in which a shell defining multiple partitions is used.

This disclosure relates to integrated circuits (ICs) and, more particularly, to using a flat shell with a user kernel for implementation in an accelerator card. Accelerator cards typically utilize ICs that require the loading of configuration data. Often, the IC manufacturer or other third party provides configuration data, referred to herein as a "shell," that implements or enables some baseline functionality within the IC. The shell may be used to facilitate implementation of user applications in the IC.

As an example, loading a shell into an IC may configure the IC to implement a predefined circuit architecture therein. The predefined circuit architecture defined by the shell, also referred to as "platform circuitry," may be implemented by configuring programmable circuitry, configuring hardwired circuitry, or configuring a combination of programmable and hardwired circuitry. The platform circuitry may define, or specify, the inputs and outputs of the IC that enable the IC to communicate with circuits external to the IC. The platform circuitry further defines one or more interfaces to which user kernels may be connected. A user kernel may refer to user program code that may be executed by a processor in the IC, user circuitry to be implemented in the IC using programmable circuitry and/or hardwired circuitry, or a combination of user circuitry and program code.

Using a shell allows a user to implement a kernel within an IC of an accelerator card without having to design the entire IC infrastructure from the ground up. This allows the user to develop a kernel that provides specific functionality to operate on a given workload or perform a particular task. The user need not create the infrastructure circuitry necessary to move data between the host system and the IC. The shell allows designers with little or no experience designing hardware to create hardware accelerated functions as kernels.

With conventional design techniques, using a shell with one's kernel required the use of dynamic function exchange technology, also known as "dynamic partial reconfiguration." That is, if a user created a kernel and did not wish to create the surrounding IC infrastructure necessary to use the kernel from scratch, the user was required to implement the shell and kernel using dynamic function exchange technology. In general, the shell defined a multipartition circuit design where the platform circuitry was implemented in a first static partition and the kernel was implemented in a second, reconfigurable partition. The shell specified the platform circuitry as a placed and routed circuit design to which the user kernel was connected. With the platform circuitry being placed and routed, each partition was implemented in its own dedicated physical region of the IC.

Though dynamic function exchange provides significant flexibility, this design technique may reduce the amount of IC resources available for use in implementing a user kernel. For example, many resources located in the region of the IC reserved for implementing the platform circuitry that go unused become locked and isolated due to a lack of available routing resources. These IC resources, though unused, are unavailable for use by the user kernel because the IC resources may not be reachable owing to the lack of available routing resources.

In accordance with the inventive arrangements described herein, a flat shell is provided that may be used with a user kernel without dynamic function exchange. The flat shell may be combined with a user provided kernel and implemented, e.g., placed and routed, as a unified circuit design. Unlike conventional shells that specify a multipartition design, the flat shell includes a single partition into which both the platform circuitry and the user kernel may be included. The platform circuitry may be provided as a synthesized circuit design that is not placed and not routed.

In providing the flat shell, neither the platform circuitry nor the kernel is implemented in a dedicated region of the IC. The user circuitry of the kernel may be comingled with the platform circuitry of the shell. This makes a larger amount of IC resources available for implementation of the kernel. IC resources that would otherwise be located in a region dedicated to the shell and unusable by the kernel become available for implementing the kernel, thereby allowing a larger amount of IC resources to be used more efficiently. In consequence, the IC may implement a kernel having a larger number of compute units (e.g., a larger and/or more complex kernel) than would otherwise be the case.

FIG. 1 illustrates an example computing environment in which a shell defining multiple partitions is used. The computing environment includes a host system 102 and an acceleration card 104. Acceleration card 104 includes an IC 110 and may include a non-volatile memory 112 and a volatile memory 118. In the example of FIG. 1, a user kernel is implemented using a shell that relies on dynamic function exchange. In this example, the shell defines a static partition and a single reconfigurable partition.

Host system 102 is implemented as a data processing system. An example implementation of a data processing system that may be used as a host system 102 is described in connection with FIG. 8. Host system 102 is capable of communicating with accelerator card 104 via a communication link 108. Communication link 108 may be implemented over a particular communication channel. In an example implementation, the communication channel is a communication bus such as, for example, a Peripheral Component Interconnect Express (PCIe) bus.

Accelerator card 104 may be implemented as a circuit board that may be communicatively linked to host system 102. Accelerator card 104 may, for example, be inserted into an available bus slot (e.g., of a PCIe bus) of host system 102 or connected to the bus via another mechanism (e.g., another port or expansion chassis). In the example, IC 110 is coupled to non-volatile memory 112 and volatile memory 118. Non-volatile memory 112 may be implemented as a flash memory and is capable of storing firmware for IC 110. Volatile memory 118 may be implemented as a random-access memory (RAM). Non-volatile memory 112 and volatile memory 118 are illustrated as being external to IC 110 and may be considered local to IC 110.

IC 110 may be implemented as any of a variety of different ICs that may require the loading of configuration data to operate. Examples of configuration data may include firmware or other program code, configuration bitstreams, or other state setting data. In one aspect, IC 110 may be implemented as a programmable IC. A programmable IC is an IC that includes at least some programmable circuitry. Programmable circuitry may include programmable logic. Examples of programmable ICs include, but are not limited to, Field Programmable Gate Arrays (FPGAs), System-on-Chips (SoCs), Application-Specific ICs having at least some programmable circuitry, and/or an Adaptive Compute Acceleration Platform (ACAP). IC 110 may be implemented as other types of ICs that may require configuration data loaded therein to operate.

Some ICs such as SoCs and/or ACAPs, include one or more subsystems that may be configured by loading configuration data into the IC. Further examples of subsystems that may be included in IC 110 and configured by configuration data include, but are not limited to, programmable circuitry (and/or programmable logic), a processor system having one or more processors and/or cores, a data processing engine array, a network-on-chip (NoC), hardwired circuit (e.g., ASIC) blocks, or any combination of the one or more example subsystems listed.

As noted, the shell used in the example of FIG. 1 defines a base partition and a reconfigurable partition. Platform circuitry 120 specified by the shell is included in the base partition. The user kernel is included in the reconfigurable partition. A static region 122 of IC 110 is reserved for implementing the base partition. As such, platform circuitry 120 specified by the shell is implemented in static region 122. A reconfigurable region 126 is reserved for implementing the reconfigurable partition. As such, user circuitry 124, as specified by the user kernel, is implemented in reconfigurable region 126. Static region 122 is separated from reconfigurable region 126 by isolation circuitry 128.

The example of FIG. 1 allows reconfigurable region 126 to be reconfigured to implement different user kernels (e.g., different user circuitry) therein over time using partial reconfiguration technology. Reconfigurable region 126 may be reconfigured while platform circuitry 120 within static region 122 continues to operate uninterrupted. Platform circuitry 120, for example, may implement communication circuitry capable of maintaining communication link 108 with host system 102 while reconfigurable region 126 is reconfigured. Maintaining communication link 108 with host system 102 during reconfiguration avoids the need to reboot host system 102 thereby avoiding undesirable system downtime. In this example, platform circuitry 120 may include additional circuitry such as, for example, memory controllers for communicating with non-volatile memory 112 and/or volatile memory 118, and the like.

Figure 2:
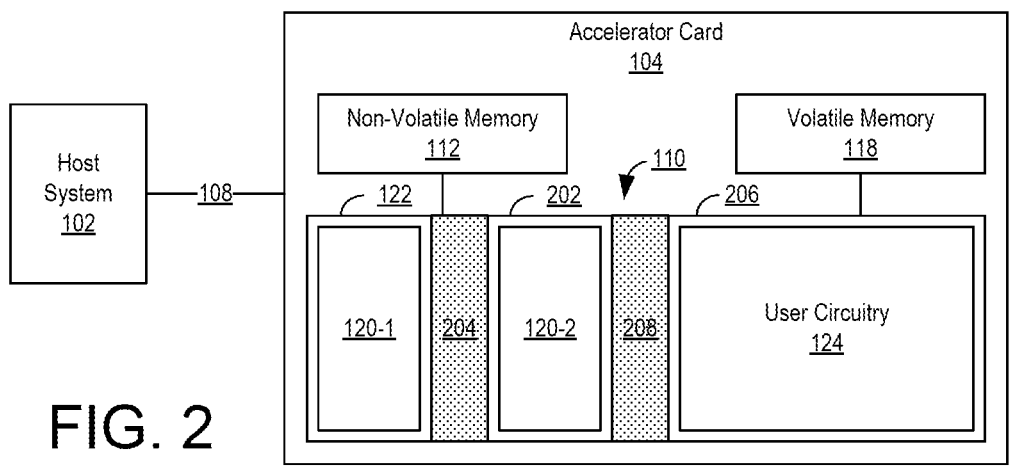
FIG. 2 illustrates another example of the computing environment of FIG. 1 in which a shell defining multiple partitions is used.

FIG. 2 illustrates another example of the computing environment of FIG. 1 in which a shell defining multiple partitions is used. In the example of FIG. 2, a user kernel is implemented using a shell that relies on dynamic function exchange. In this example, the shell defines a static partition, a first reconfigurable partition, and a second reconfigurable partition.

In the example of FIG. 2, platform circuitry 120 is broken out into two sections 122-1 and 122-2 that are implemented in the static partition and the first reconfigurable partition, respectively. Static region 122 is reserved for implementing the static partition and, as such, implements platform circuitry 120-1. A first reconfigurable region 202 is reserved for implementing the first reconfigurable partition and, as such, implements platform circuitry 120-2. Static region 122 is separated from reconfigurable region 202 by isolation circuitry 204. A second reconfigurable region 206 is reserved for implementing the second reconfigurable partition and, as such, implements user circuitry 124. Reconfigurable region 202 is separated from reconfigurable region 206 by isolation circuitry 208.

The example of FIG. 2 allows reconfigurable region 206 to be reconfigured to implement different user kernels therein over time using partial reconfiguration technology. Reconfigurable region 206 may be reconfigured while platform circuitry 120-1 within static region 122 and platform circuitry 120-2 within reconfigurable region 202 continues to operate uninterrupted. In the example of FIG. 2, platform circuitry 120 is subdivided so that, for example, circuitry for communicating with host system 102 is included in platform circuitry 120-1, while other circuitry (e.g., memory controllers and/or other infrastructure circuitry) may be implemented in reconfigurable region 202. As such, at least a portion of platform circuitry 120 (e.g., 120-2) may be updated over time while maintaining communication link 108 with host system 102.

Referring to the examples of FIGS. 1-2, the use of dynamic partial reconfiguration, while providing significant flexibility, also has the effect of locking resources in static regions. The locked resources arise from the partitioning necessary to implement dynamic partial reconfiguration in the examples of FIGS. 1-2. The partitioning relies on interface pin-driven floorplans, constraints on the shape of the partitions as physically realized in the regions of the IC (e.g., defining the location, length, and width of the static and reconfiguration regions), routing constraints, and other architectural considerations. These resources, though unused by the platform circuitry, may not be used to implement user circuitry. In some cases, the partitioning described may lock 10-20 percent of IC resources thereby reducing the amount of IC resources available for the user circuitry. As noted, this can limit the number of compute units that may be implemented in the reconfigurable region of the IC.

In the examples of FIGS. 1 and 2, the isolation circuitry is needed to electrically isolate interfaces between the various regions to enable dynamic partial reconfiguration. The isolation circuitry also consumes resources of IC 110, thereby reducing the available resources for implementing user circuitry.

Further, in the examples of FIGS. 1 and 2, the shells are provided as a fully placed and routed circuit design. That is, the platform circuitry specified by the shell is fully placed and routed. The shell is typically provided to the user by a third party (e.g., IC manufacturer, datacenter operator, etc.) and is considered a trusted and known good circuit design. The user kernel is synthesized, placed, and routed to match the placed pins of interfaces of the platform circuitry to connect to the platform circuitry of the shell. Being placed and routed, the user kernel is effectively implemented around the already implemented platform circuitry of the shell.

Figure 3:
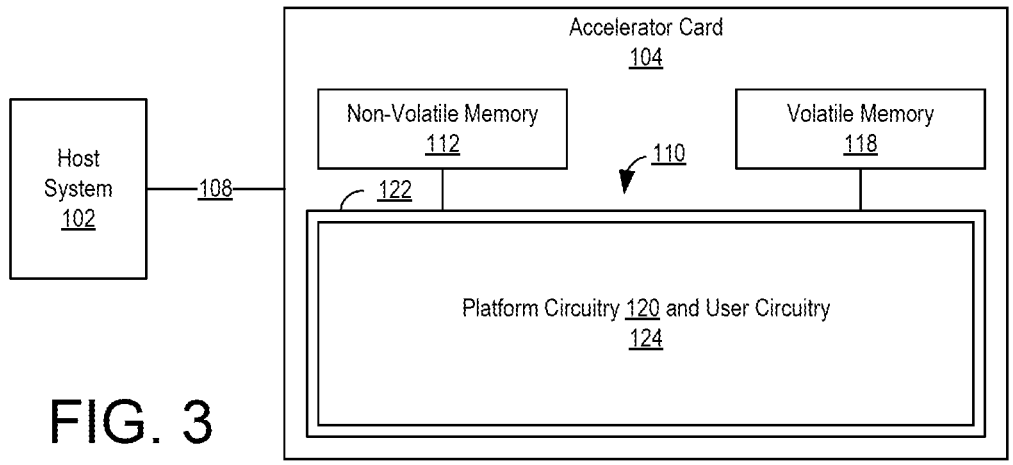
FIG. 3 illustrates another example of the computing environment of FIG. 1 in which a flat shell is used.

FIG. 3 illustrates another example of the computing environment of FIG. 1 in which a flat shell is used. As defined within this disclosure, the term "flat shell" means a shell that includes only a single partition. A flat shell does not define or include any reconfigurable partitions. The use of a flat shell does not create any reconfigurable regions on the IC.

In the example of FIG. 3, platform circuitry 120 and user circuitry 124 are implemented together within static region 122. The platform circuitry 120 and user circuitry 124 are not separated by isolation circuitry. The flat shell used in the example of FIG. 3 does not support dynamic partial reconfiguration. Using the flat shell with a user kernel increases the amount of resources of IC 110 that are available for implementation of the user kernel. The increase arises from the lack of isolation circuitry, the lack of partitioning, and the lack of dedicated regions of IC 110 for implementation of different partitions.

Figure 4:
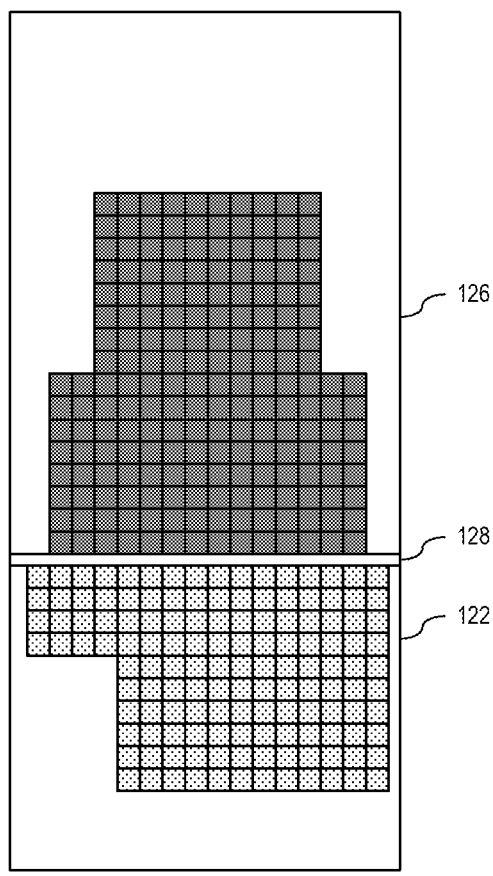
FIG. 4 illustrates an example floorplan for an integrated circuit (IC) using a shell including one reconfigurable partition.

FIG. 4 illustrates an example floorplan for IC 110 using a shell including one reconfigurable partition. As pictured, IC 110 includes static region 122 and reconfigurable region 126 separated by isolation circuitry 128. In the example, platform circuitry 120 is implemented entirely within static region 122. User circuitry 124 is implemented entirely within reconfigurable region 126. Unused portions of IC 110 located in static region 122 (empty space in static region 122) may not be used for implementing user circuitry. In general, insufficient resources exist to route signals to such blocks in IC 110. In the example of FIG. 4, there is no comingling of platform circuitry 120 with user circuitry 124. Each is implemented entirely within its own region of IC 110.

Figure 5:
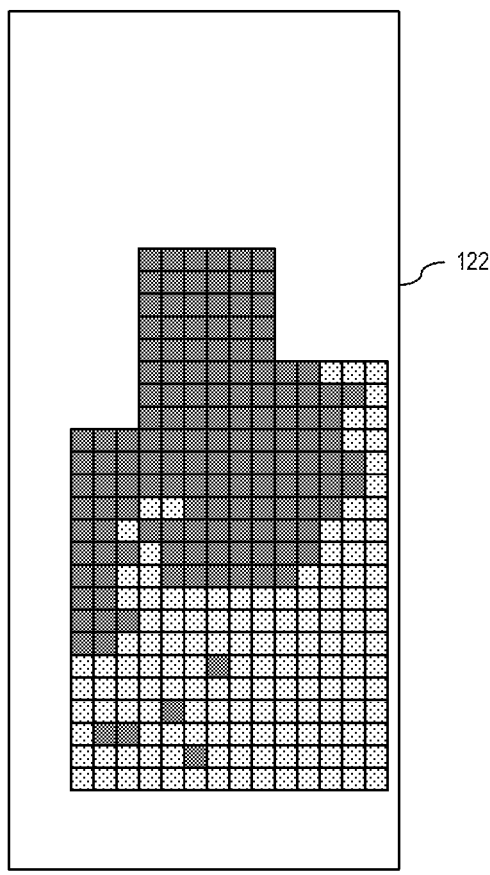
FIG. 5 illustrates an example floorplan for IC using a flat shell having no reconfigurable partitions.

FIG. 5 illustrates an example floorplan for IC 110 using a flat shell having no reconfigurable partitions. As pictured, IC 110 includes only a static region 122 including both platform circuitry 120 and user circuitry 124. In the example of FIG. 5, the portions of platform circuitry 120 and user circuitry 124 are comingled. Platform circuitry 120 and user circuitry 124 are not constrained as to the particular location that each respective type of circuitry may be located on IC 110. The example of FIG. 5 facilitates more efficient usage of existing resources of IC 110 and provides greater flexibility in implementation of both platform circuitry 120 and user circuitry 124. The implementation tools, for example, without the fixed placement and routing of the platform circuitry 120, may utilize blocks for user circuitry 124 and route signals to such blocks that would not have been possible in the example of FIG. 4.

Figure 6:
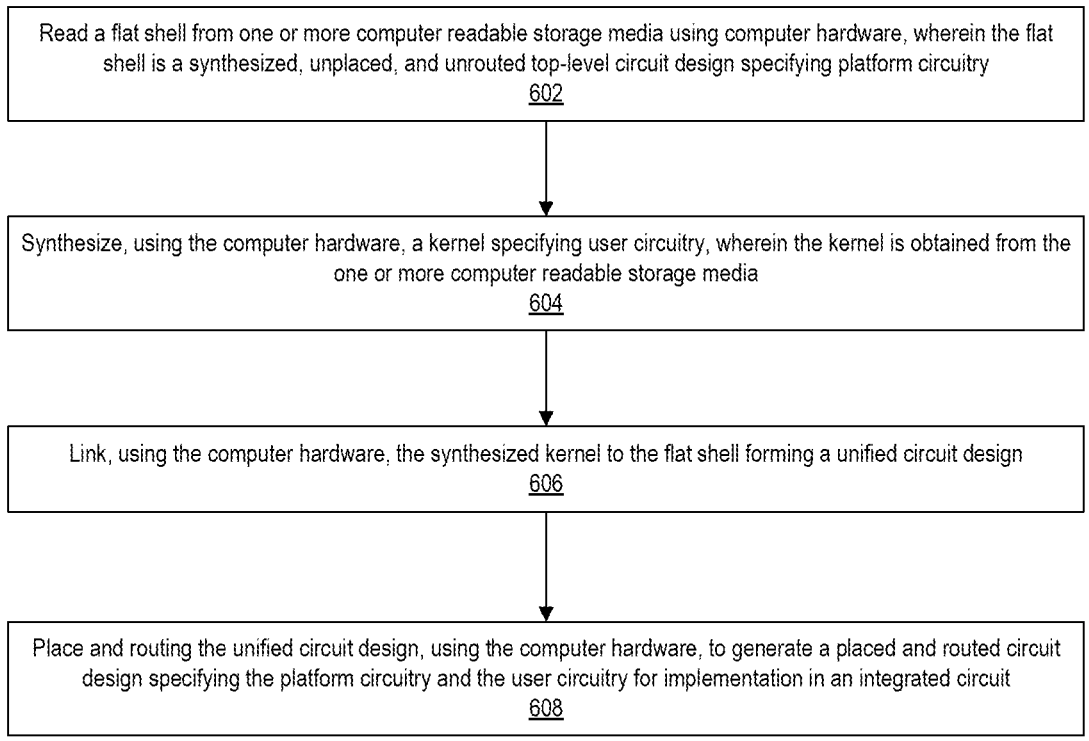
FIG. 6 is an example method of using a flat shell.

FIG. 6 is an example method of using a flat shell. The method of FIG. 6 may be performed by a data processing system executing suitable operational software such as an Electronic Design Automation (EDA) application. An example of a data processing system and host system 102 is described in connection with FIG. 8.

In block 602, the system is capable of reading a flat shell from one or more computer readable storage media, where the flat shell is stored. The flat shell is a synthesized, top-level circuit design that specifies platform circuitry. The flat shell is unplaced and is unrouted.

In one aspect, the flat shell specifies only a static partition. That is, the flat shell does not define any reconfigurable partitions that are to be implemented in a reconfigurable region of the IC. In this regard, the flat shell does not support dynamic partial reconfiguration. The flat shell does not include any constraints defining the particular regions in which platform circuitry and user circuitry are to be implemented.

In block 604, the system is capable of synthesizing a kernel. The kernel may be user provided and, as such, specify user circuitry. The kernel is to connect to the platform circuitry specified by the flat shell. The kernel may also be obtained, e.g., read, from the one or more computer readable storage media.

In one aspect, the user provided kernel may be specified in a hardware description language, e.g., in register-transfer level (RTL) form. In another aspect, the user provided kernel may be specified in a high-level programming language such as C and/or C++ and converted to hardware description language through a high-level synthesis process performed by the system. Once the kernel is specified in hardware description language, the user kernel may be synthesized.

In block 606, the system is capable of linking the synthesized kernel to the flat shell forming a unified circuit design. The linking effectively couples the port(s) of the synthesized kernel to the available interface(s) of the flat shell. The unified circuit design includes the platform circuitry and the user circuitry in a same partition.

In one example implementation, the flat shell may be opened within a workspace of the system. A workspace is a design environment generated by execution of the EDA application in which a circuit design may be opened and/or edited. The system, for example, in executing the EDA application, may provide a workspace in which circuit designs may be created and/or opened. The flat shell may be displayed within the workspace as a block design. The synthesized kernel may be displayed as a block within the workspace that may be connected to an existing block of the flat shell. In one aspect, the system is capable of automatically generating the connections between the synthesized kernel and the flat shell by connecting the block representing the synthesized kernel and the block of the flat shell. In another aspect, the user may create the connections using the system by providing suitable input.

In block 608, the system is capable of placing and routing the unified circuit design to generate a placed and routed circuit design specifying the platform circuitry and the user circuitry for implementation in an IC. In one aspect, the system is capable of performing the placement and routing without constraining the platform circuitry and without constraining the user circuitry to any particular regions on the integrated circuit. The placement and routing performed by the system may be performed on both the platform circuitry and the user circuitry together as a unified circuit design.

In one aspect, the placed and routed circuit design is generated as a single configuration file (e.g., as opposed to one file corresponding to the platform circuitry and another corresponding to the user circuitry). The placed and routed circuit design, e.g., configuration data that may be loaded into IC 110, may comingle at least a portion of the platform circuitry with at least a portion of the user circuitry on the integrated circuit as illustrated in the example of FIG. 5.

In one aspect, the system is configured to prevent user editing of the flat shell. For example, the EDA application executed by the system, though able to perform placement and routing of the flat shell in combination with the synthesized kernel, does not allow a user to edit or modify the flat shell.

The platform circuitry defined by the shell implements inputs and outputs of the IC for communicating with circuits external to the IC. As a top-level circuit design, for example, the flat shell may be the top hierarchical level that defines the available inputs and outputs to which the kernel may obtain access by connecting to, or integrating with, the flat shell. The flat shell further defines each available interface to which a kernel may be coupled.

Figure 7:
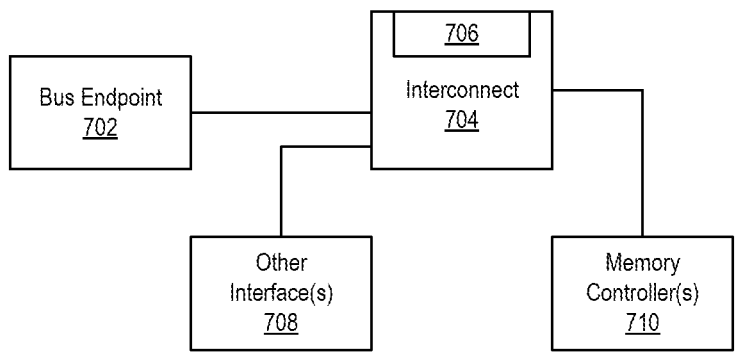
FIG. 7 illustrates an example circuit architecture for implementing platform circuitry.

FIG. 7 illustrates an example circuit architecture for implementing platform circuitry. It should be appreciated that the example circuit architecture illustrated in FIG. 7 is provided for purposes of illustration and not limitation. Other circuit architectures may be used to implement platform circuitry that differ from the example shown. The example architecture of FIG. 7 illustrates certain operative features of platform circuitry including, but not limited to, the ability to connect to and/or communicate with a host system, one or more interfaces to couple to kernel(s), and additional optional circuit blocks for coupling with other circuits and/or systems external to the IC.

As pictured, the example circuit architecture of FIG. 7 includes a bus endpoint 702. Bus endpoint 702 is capable of communicating with host system 102 via communication channel 108. For example, bus endpoint 702 may be a PCIe endpoint capable of communicating with host system 102 via a PCIe connection. Bus endpoint 702 may be coupled to an interconnect 704. Interconnect 704 may be implemented as on-chip interconnect. An example of an on-chip interconnect is an Advanced Microcontroller Bus Architecture (AMBA) eXtensible Interface (AXI) bus. An AXI bus is an embedded microcontroller bus interface for use in establishing on-chip connections between circuit blocks and/or systems. Other example implementations of interconnect 704 may include, but are not limited to, other buses, cross-bars, Network-on-Chips (NoCs), and so forth. Interconnect 704 may include a variety of different interfaces such as interface 706. Interface 706 is configured to connect to a user provided kernel. Interconnect 704 may include additional interfaces capable of connecting to other optional circuit components such as one or more other interfaces 708 (e.g., Universal Serial Bus (USB), Ethernet, etc.) and/or one or more memory controllers 710.

For purposes of illustration, in one example, the entire circuit architecture shown in FIG. 7 may be implemented as platform circuitry 120 of FIG. 1. Referring to the example of FIG. 2, bus endpoint 702 may be included in platform circuitry 120-1, while the other components of FIG. 7 are implemented in platform circuitry 120-2.

Figure 8:
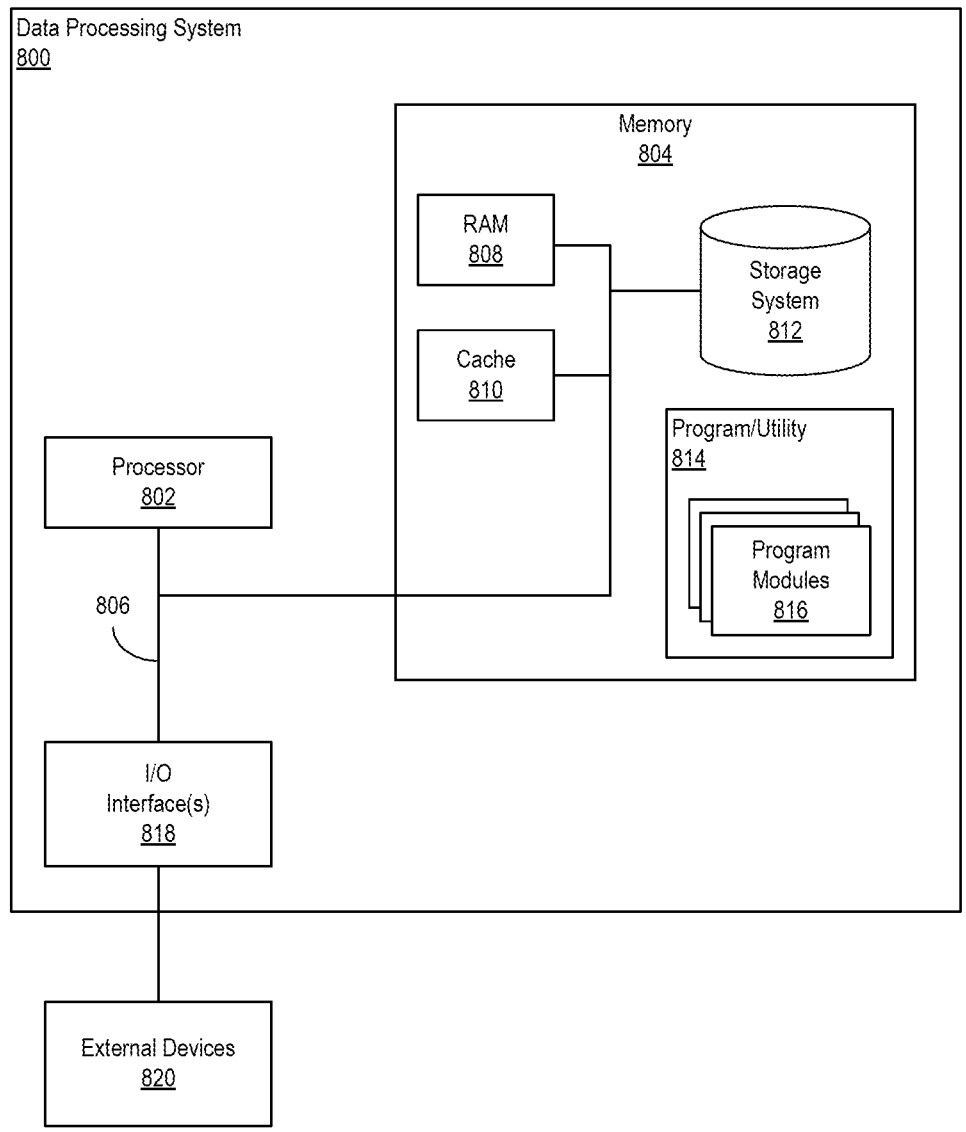
FIG. 8 illustrates an example implementation of a data processing system.

FIG. 8 illustrates an example implementation of a data processing system 800. The components of data processing system 800 can include, but are not limited to, a processor 802, a memory 804, and a bus 806 that couples various system components including memory 804 to processor 802. Processor 802 may be implemented as one or more processors. In an example, processor 802 is implemented as a central processing unit (CPU). Example processor types include, but are not limited to, processors having an x86 type of architecture (IA-32, IA-64, etc.), Power Architecture, ARM processors, and the like.

Bus 806 represents one or more of any of a variety of communication bus structures. By way of example, and not limitation, bus 806 may be implemented as a PCIe bus. Data processing system 800 typically includes a variety of computer system readable media. Such media may include computer-readable volatile and non-volatile media and computer-readable removable and non-removable media.

Memory 804 can include computer-readable media in the form of volatile memory, such as random-access memory (RAM) 808 and/or cache memory 810. Data processing system 800 also can include other removable/non-removable, volatile/non-volatile computer storage media. By way of example, storage system 812 can be provided for reading from and writing to a non-removable, non-volatile magnetic and/or solid-state media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 806 by one or more data media interfaces. Memory 804 is an example of at least one computer program product.

Program/utility 814, having a set (at least one) of program modules 816, may be stored in memory 804. By way of example, program modules 816 may represent an operating system, one or more application programs, other program modules, and program data. Program modules 816 generally carry out the functions and/or methodologies of the example implementations described within this disclosure. For example, one or more of program modules 816 can implement the drivers used to communicate with accelerator card 104 and/or one or more EDA applications capable of performing the various operations described within this disclosure upon execution by data processing system 800.

Program/utility 814 is executable by processor 802. Program/utility 814 and any data items used, generated, and/or operated upon by data processing system 800 are functional data structures that impart functionality when employed by data processing system 800.

Data processing system 800 may include one or more Input/Output (I/O) interfaces 818 communicatively linked to bus 806. I/O interface(s) 818 allow data processing system 800 to communicate with one or more external devices 820 and/or communicate over one or more networks such as a local area network (LAN), a wide area network (WAN), and/or a public network (e.g., the Internet). Examples of I/O interfaces 818 may include, but are not limited to, network cards, modems, network adapters, hardware controllers, etc. Examples of external devices also may include devices that allow a user to interact with data processing system 800 (e.g., a display, a keyboard, and/or a pointing device) and/or other devices such as accelerator card 104.

Data processing system 800 is only one example implementation. Data processing system 800 can be practiced as a standalone device (e.g., as a user computing device or a server, as a bare metal server), in a cluster (e.g., two or more interconnected computers), or in a distributed cloud computing environment (e.g., as a cloud computing node) where tasks are performed by remote processing devices that are linked through a communications network. In a distributed cloud computing environment, program modules may be located in both local and remote computer system storage media including memory storage devices. The example of FIG. 8 is not intended to suggest any limitation as to the scope of use or functionality of example implementations described herein. Data processing system is an example of computer hardware that is capable of performing the various operations described within this disclosure.

In this regard, data processing system 800 may include fewer components than shown or additional components not illustrated in FIG. 8 depending upon the particular type of device and/or system that is implemented. The particular operating system and/or application(s) included may vary according to device and/or system type as may the types of I/O devices included. Further, one or more of the illustrative components may be incorporated into, or otherwise form a portion of, another component. For example, a processor may include at least some memory.

Data processing system 800 may be operational with numerous other general-purpose or special-purpose computing system environments or configurations. Examples of computing systems, environments, and/or configurations that may be suitable for use with data processing system 800 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Some computing environments, e.g., cloud computing environments and/or edge computing environments using data processing system 800 or other suitable data processing system, generally support the FPGA-as-a-Service (FaaS) model. In the FaaS model, user functions are hardware accelerated as circuit designs implemented within programmable ICs operating under control of the (host) data processing system. Other examples of cloud computing models are described in the National Institute of Standards and Technology (NIST) and, more particularly, the Information Technology Laboratory of NIST.

Figure 9:
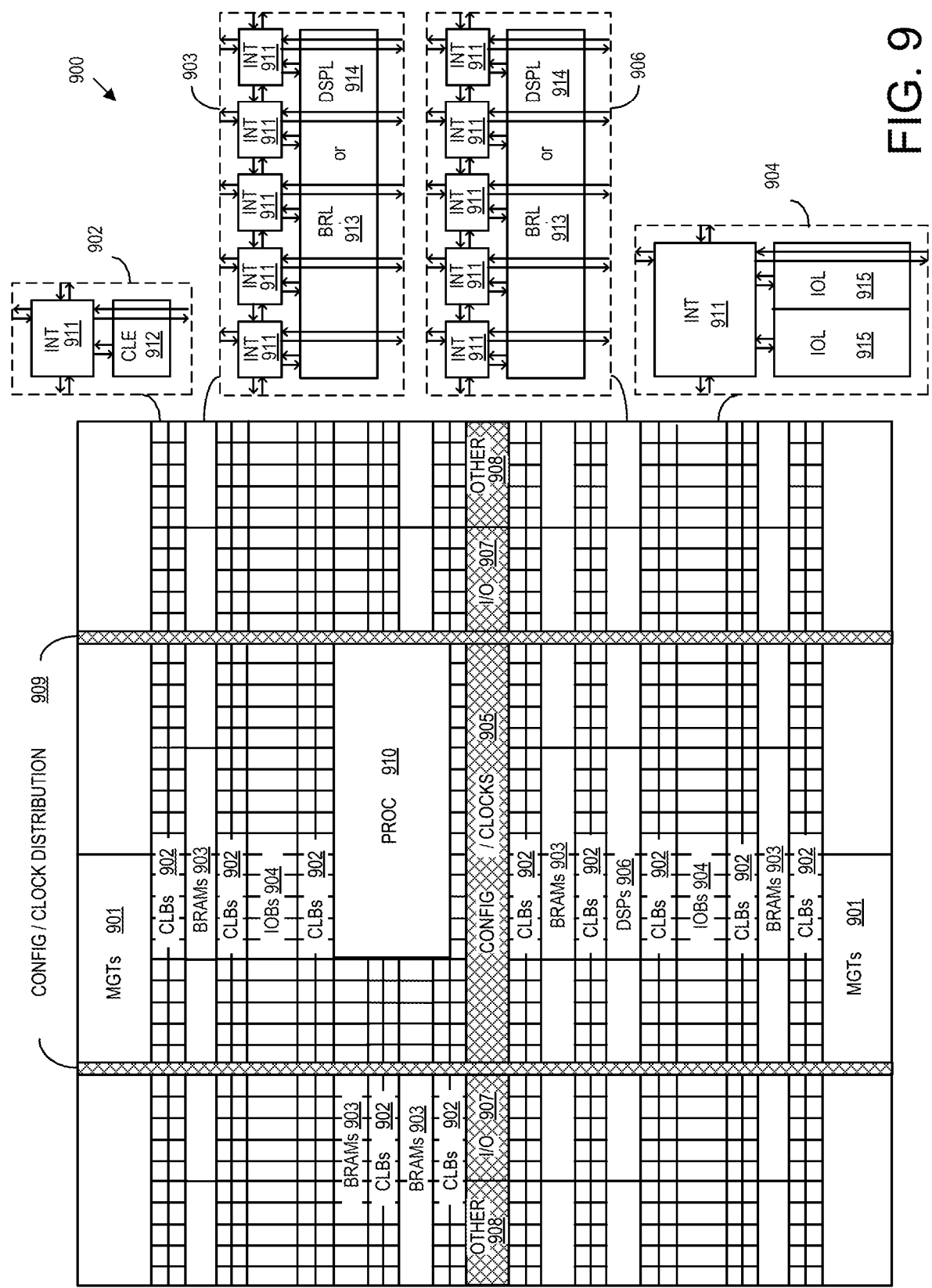
FIG. 9 illustrates an example architecture for an IC.

FIG. 9 illustrates an example architecture 900 for an IC. In one aspect, architecture 900 may be implemented within a programmable IC. For example, architecture 900 may be used to implement an FPGA. Architecture 900 may also be representative of an SoC type of IC. An example of an SoC is an IC that includes a processor that executes program code and one or more other circuits. The other circuits may be implemented as hardwired circuitry, programmable circuitry, and/or a combination thereof. The circuits may operate cooperatively with one another and/or with the processor.

As shown, architecture 900 includes several different types of programmable circuit, e.g., logic, blocks. For example, architecture 900 may include a large number of different programmable tiles including multi-gigabit transceivers (MGTs) 901, configurable logic blocks (CLBs) 902, random-access memory blocks (BRAMs) 903, input/output blocks (IOBs) 904, configuration and clocking logic (CONFIG/CLOCKS) 904, digital signal processing blocks (DSPs) 906, specialized I/O blocks 907 (e.g., configuration ports and clock ports), and other programmable logic 908 such as digital clock managers, analog-to-digital converters, system monitoring logic, and so forth.

In some ICs, each programmable tile includes a programmable interconnect element (INT) 911 having standardized connections to and from a corresponding INT 911 in each adjacent tile. Therefore, INTs 911, taken together, implement the programmable interconnect structure for the illustrated IC. Each INT 911 also includes the connections to and from the programmable logic element within the same tile, as shown by the examples included at the right of FIG. 9.

For example, a CLB 902 may include a configurable logic element (CLE) 912 that may be programmed to implement user logic plus a single INT 911. A BRAM 903 may include a BRAM logic element (BRL) 913 in addition to one or more INTs 911. Typically, the number of INTs 911 included in a tile depends on the height of the tile. As pictured, a BRAM tile has the same height as five CLBs, but other numbers (e.g., four) also may be used. A DSP tile 906 may include a DSP logic element (DSPL) 914 in addition to an appropriate number of INTs 911. An 10B 904 may include, for example, two instances of an I/O logic element (IOL) 915 in addition to one instance of an INT 911. The actual I/O pads connected to IOL 915 may not be confined to the area of IOL 915.

In the example pictured in FIG. 9, the shaded area near the center of the die, e.g., formed of regions 905, 907, and 908, may be used for configuration, clock, and other control logic. Shaded areas 909 may be used to distribute the clocks and configuration signals across the breadth of the programmable IC.

Some ICs utilizing the architecture illustrated in FIG. 9 include additional logic blocks that disrupt the regular columnar structure making up a large part of the IC. The additional logic blocks may be programmable blocks and/or dedicated circuitry. For example, a processor block depicted as PROC 910 spans several columns of CLBs and BRAMs.

In one aspect, PROC 910 may be implemented as dedicated circuitry, e.g., as a hardwired processor, that is fabricated as part of the die that implements the programmable circuitry of the IC. PROC 910 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 910 may be omitted from architecture 900 and replaced with one or more of the other varieties of the programmable blocks described. Further, such blocks may be utilized to form a "soft processor" in that the various blocks of programmable circuitry may be used to form a processor that can execute program code as is the case with PROC 910.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 9 that are external to PROC 910 such as CLBs 902 and BRAMs 903 are considered programmable circuitry of the IC.

In general, the functionality of programmable circuitry is not established until configuration data is loaded into the IC. In some cases, the configuration data is set of configuration bits, also referred to as a configuration bitstream, that may be used to program programmable circuitry of an IC. In general, programmable circuitry is not operational or functional without first loading configuration data into the IC. The configuration data effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of configuration data. Hardwired circuitry is generally considered to have dedicated circuit blocks and interconnects, for example, that are functional without first loading configuration data into the IC, e.g., PROC 910.

In some instances, hardwired circuitry may have one or more operational modes that can be set or selected according to register settings or values stored in one or more memory elements within the IC. The operational modes may be set, for example, through the loading of configuration data into the IC. Despite this ability, hardwired circuitry is not considered programmable circuitry as the hardwired circuitry is operable and has a particular function when manufactured as part of the IC.

In the case of an SoC, the configuration data may specify the circuitry that is to be implemented within the programmable circuitry and the program code that is to be executed by PROC 910 or a soft processor. In some cases, architecture 900 includes a dedicated configuration processor that loads the configuration bitstream to the appropriate configuration memory and/or processor memory. The dedicated configuration processor does not execute user-specified program code. In other cases, architecture 900 may utilize PROC 910 to receive the configuration bitstream, load the configuration bitstream into appropriate configuration memory, and/or extract program code for execution.

FIG. 9 is intended to illustrate an example architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the right of FIG. 9 are purely illustrative. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 910 within the IC are for purposes of illustration only and are not intended as limitations.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

As defined herein, the singular forms "a," "an," and "the" are intended to include the plural forms as well, unless the context clearly indicates otherwise.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention. As defined herein, the term "user" means a human being.

As used herein, the term "cloud computing" refers to a computing model that facilitates convenient, on-demand network access to a shared pool of configurable computing resources such as networks, servers, storage, applications, ICs (e.g., programmable ICs) and/or services. These computing resources may be rapidly provisioned and released with minimal management effort or service provider interaction. Cloud computing promotes availability and may be characterized by on-demand self-service, broad network access, resource pooling, rapid elasticity, and measured service.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random-access memory (SRAM), a portable compact disc read-only memory (CD-ROM), a digital versatile disk (DVD), a memory stick, a floppy disk, or the like.

As defined within this disclosure, the term "data structure" means a physical implementation of a data model's organization of data within a physical memory. As such, a data structure is formed of specific electrical or magnetic structural elements in a memory. A data structure imposes physical organization on the data stored in the memory as used by an application program executed using a processor.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, "data processing system" means one or more hardware systems configured to process data, each hardware system including at least one processor programmed to initiate operations and memory.

As defined herein, the term "processor" means at least one circuit capable of carrying out instructions contained in program code. The circuit may be an integrated circuit or embedded in an integrated circuit.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

What is claimed is:

1. A method, comprising:
reading a flat shell from one or more computer readable storage media using computer hardware, wherein the flat shell is a synthesized, unplaced, and unrouted top-level circuit design specifying platform circuitry;
synthesizing, using the computer hardware, a kernel specifying user circuitry, wherein the kernel is obtained from the one or more computer readable storage media;
linking, using the computer hardware, the synthesized kernel to the flat shell forming a unified circuit design; and
using the computer hardware, placing and routing the unified circuit design to generate a placed and routed circuit design specifying the platform circuitry and the user circuitry for implementation in an integrated circuit.

2. The method of claim 1, wherein the computer hardware is configured to prevent user editing of the flat shell.

3. The method of claim 1, wherein the platform circuitry implements inputs and outputs of the integrated circuit for communicating with circuits external to the integrated circuit.

4. The method of claim 3, wherein the platform circuitry defines each interface that couples to the kernel.

5. The method of claim 1, wherein the flat shell is opened within a workspace of an electronic design application as a block design and the kernel is included within the workspace as a block of the block design.

6. The method of claim 1, wherein the unified circuit design includes the platform circuitry and the user circuitry in a same partition.

7. The method of claim 1, wherein the placed and routed circuit design comingles at least a portion of the platform circuitry with at least a portion of the user circuitry on the integrated circuit.

8. The method of claim 1, wherein the placing and routing the unified circuit design operates without constraining the platform circuitry and without constraining the user circuitry to any particular regions on the integrated circuit.

9. A system, comprising:
a processor configured to initiate operations including:
reading a flat shell from one or more computer readable storage media, wherein the flat shell is a synthesized, unplaced, and unrouted top-level circuit design specifying platform circuitry;
synthesizing a kernel specifying user circuitry, wherein the kernel is obtained from the one or more computer readable storage media;
linking the synthesized kernel to the flat shell forming a unified circuit design; and
placing and routing the unified circuit design to generate a placed and routed circuit design specifying the platform circuitry and the user circuitry for implementation in an integrated circuit.

10. The system of claim 9, wherein the processor is configured to prevent user editing of the flat shell.

11. The system of claim 9, wherein the platform circuitry implements inputs and outputs of the integrated circuit for communicating with circuits external to the integrated circuit.

12. The system of claim 9, wherein the platform circuitry defines each interface that couples to the kernel.

13. The system of claim 9, wherein the flat shell is opened within a workspace of an electronic design application as a block design and the kernel is included within the workspace as a block of the block design.

14. The system of claim 9, wherein the unified circuit design includes the platform circuitry and the user circuitry in a same partition.

15. The system of claim 9, wherein the placed and routed circuit design comingles at least a portion of the platform circuitry with at least a portion of the user circuitry on the integrated circuit.

16. The system of claim 9, wherein the placing and routing the unified circuit design operates without constraining the platform circuitry and without constraining the user circuitry to any particular regions on the integrated circuit.

17. A computer program product, comprising:
one or more computer readable storage media, and program instructions collectively stored on the one or more computer readable storage media, wherein the program instructions are executable by computer hardware to initiate operations including:
reading a flat shell from the one or more computer readable storage media, wherein the flat shell is a synthesized, unplaced, and unrouted top-level circuit design specifying platform circuitry;
synthesizing a kernel specifying user circuitry, wherein the kernel is obtained from the one or more computer readable storage media;
linking the synthesized kernel to the flat shell forming a unified circuit design; and
placing and routing the unified circuit design to generate a placed and routed circuit design specifying the platform circuitry and the user circuitry for implementation in an integrated circuit.

18. The computer program product of claim 17, wherein the computer hardware, in executing the program instructions, is configured to prevent user editing of the flat shell.

19. The computer program product of claim 17, wherein the platform circuitry:
implements inputs and outputs of the integrated circuit for communicating with circuits external to the integrated circuit; and
defines each interface that couples to the kernel.

20. The computer program product of claim 17, wherein the placed and routed circuit design comingles at least a portion of the platform circuitry with at least a portion of the user circuitry on the integrated circuit.

* * * * *